(12) United States Patent
Boettcher et al.

(10) Patent No.: US 8,981,566 B2
(45) Date of Patent: Mar. 17, 2015

(54) DISCRETE SEMICONDUCTOR DEVICE PACKAGE AND MANUFACTURING METHOD

(71) Applicant: NXP B.V., Eindhoven (NL)

(72) Inventors: Tim Boettcher, Lauenbrueck (DE); Sven Walczyk, Waalre (NL); Roelf Anco Jacob Groenhuis, Nijmegen (NL); Rolf Brenner, Hamburg (DE); Emiel De Bruin, Elst (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/890,055

(22) Filed: May 8, 2013

(65) Prior Publication Data

US 2013/0320551 A1 Dec. 5, 2013

(30) Foreign Application Priority Data

Jun. 1, 2012 (EP) .................................... 12170528

(51) Int. Cl.
*H01L 23/48* (2006.01)
*H01L 23/00* (2006.01)
(Continued)

(52) U.S. Cl.
CPC ................ *H01L 24/12* (2013.01); *H01L 24/03* (2013.01); *H01L 24/05* (2013.01); *H01L 24/06* (2013.01); *H01L 25/0657* (2013.01); *H01L 24/11* (2013.01); *H01L 25/50* (2013.01); *H01L 2224/051* (2013.01); *H01L 2224/05088* (2013.01); *H01L 2224/20* (2013.01); *H01L 24/13* (2013.01); *H01L 24/16* (2013.01); *H01L 24/81* (2013.01); *H01L 2224/04105* (2013.01);
(Continued)

(58) Field of Classification Search
CPC ................ H01L 23/48; H01L 2924/14; H01L 2924/01079; H01L 2924/01013

USPC .................. 257/773, 737, 738, 772, E23.023, 257/E23.021
See application file for complete search history.

(56) References Cited

U.S. PATENT DOCUMENTS

2002/0109201 A1 8/2002 Chen
2003/0106924 A1 6/2003 Nobori et al.
(Continued)

FOREIGN PATENT DOCUMENTS

DE   10 2004 030042 A1   1/2006
EP        2 421 032 A1   2/2012
(Continued)

OTHER PUBLICATIONS

Extended European Search Report for European Patent Appln. No. 12170528.9 (Oct. 10, 2012).

*Primary Examiner* — Timor Karimy

(57) ABSTRACT

Disclosed is a discrete semiconductor device package (100) comprising a semiconductor die (110) having a first surface and a second surface opposite said first surface carrying a contact (112); a conductive body (120) on said contact; an encapsulation material (130) laterally encapsulating said conductive body; and a capping member (140, 610) such as a solder cap, a further semiconductor die or a combination thereof in conductive contact with the solder portion, said solder cap extending over the encapsulation material. A further solder cap (150) may be provided over the first surface. A method of manufacturing such a discrete semiconductor device package is also disclosed.

9 Claims, 8 Drawing Sheets

Figure 1:
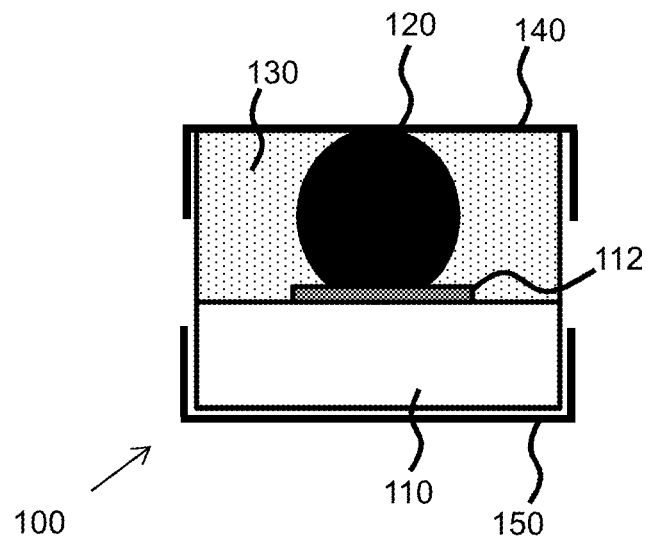

(51) Int. Cl.
*H01L 25/065* (2006.01)
*H01L 25/00* (2006.01)

(52) U.S. Cl.
CPC .......... *H01L2224/05016* (2013.01); *H01L 2224/06181* (2013.01); *H01L 2224/94* (2013.01); *H01L 2924/10253* (2013.01); *H01L 2224/32113* (2013.01); *H01L 2224/32105* (2013.01); *H01L 24/29* (2013.01); *H01L 24/32* (2013.01); *H01L 24/33* (2013.01); *H01L 2224/0346* (2013.01); *H01L 2224/04026* (2013.01); *H01L 2224/05111* (2013.01); *H01L 2224/05147* (2013.01); *H01L 2224/05573* (2013.01); *H01L 2224/05582* (2013.01); *H01L 2224/05611* (2013.01); *H01L 2224/05639* (2013.01); *H01L 2224/05644* (2013.01); *H01L 2224/13147* (2013.01); *H01L 2224/291* (2013.01); *H01L 2224/33181* (2013.01); *H01L 2224/9202* (2013.01); *H01L 2224/96* (2013.01); *H01L 2224/05568* (2013.01); *H01L 2225/06513* (2013.01); *H01L 2225/06565* (2013.01); *H01L 2224/16145* (2013.01); *H01L 2224/32237* (2013.01)
USPC .......... 257/773; 257/737; 257/738; 257/772; 257/E23.021; 257/E21.023

(56) References Cited

U.S. PATENT DOCUMENTS

| | | |
|---|---|---|
| 2005/0029666 A1 | 2/2005 | Kurihara et al. |
| 2006/0060891 A1 | 3/2006 | Pavier |
| 2009/0061561 A1 | 3/2009 | Tanaka et al. |
| 2012/0032350 A1 * | 2/2012 | Warren et al. .................. 257/782 |
| 2012/0112351 A1 | 5/2012 | Walczyk et al. |
| 2012/0286410 A1 | 11/2012 | Groenhusi et al. |

FOREIGN PATENT DOCUMENTS

| | | |
|---|---|---|
| EP | 2 453 474 A1 | 5/2012 |
| EP | 2 453 476 A1 | 5/2012 |
| WO | 9904430 | 1/1999 |

* cited by examiner

DISCRETE SEMICONDUCTOR DEVICE PACKAGE AND MANUFACTURING METHOD

CROSS-REFERENCE TO RELATED APPLICATIONS

This application claims the priority under 35 U.S.C. § 119 of European patent application no. 12170528.9, filed on Jun. 1, 2012, the contents of which are incorporated by reference herein.

FIELD OF THE INVENTION

The present invention relates to a discrete semiconductor device package. The present invention further relates to a method of packaging a discrete semiconductor device such as a diode.

BACKGROUND OF THE INVENTION

Discrete semiconductor devices such as diodes are typically provided in a package when marketed. The package protects the discrete semiconductor device from accidental damage and provides the contacts for integrating the discrete semiconductor device in a larger electronic device, e.g. by mounting the discrete semiconductor device on a carrier such as a printer circuit board (PCB). In the known packaging approaches, the package contacts are typically fan-outs of the contacts of the discrete semiconductor device, i.e. have a larger area, as manufacturing approaches to reproduce the small dimensions of a discrete semiconductor device at the package level in a straightforward and cost-effective manner are currently unavailable.

As a consequence of the ongoing miniaturization of semiconductor devices including discrete semiconductor devices, the corresponding package sizes have to be miniaturized as well. This, however, is not trivial, as the fan-out of the package contacts poses a lower limit of the dimensions of the package. For instance, for diode packages, it is difficult to miniaturize the package beyond dimensions of 0.6 mm×0.3 mm×0.3 mm. Such packages are also referred to as 0603 packages.

Such discrete semiconductor packages are commonly manufactured using a lead-frame package design, in which the connection from the semiconductor die or crystal to a carrier contact is provided via a wire bond. However, miniaturization beyond the dimensions of the 0603 packages makes it cumbersome and time-consuming to apply wire bonds, thus making the use of such connections practically unfeasible.

SUMMARY OF THE INVENTION

The present invention seeks to provide a discrete semiconductor package that avoids the need for wire bonds to be used when mounting the package on a carrier such as a PCB The present invention further seeks to provide a packaging method that facilitates further miniaturization of discrete semiconductor device packages and in particular diode packages.

According to a first aspect of the present invention, there is provided a discrete semiconductor device package comprising a semiconductor die having a first surface and a second surface opposite said first surface carrying a contact; a conductive body on said contact; an encapsulation material laterally encapsulating said conductive body; and a capping member in conductive contact with the conductive body, said capping member extending over the encapsulation material.

The conductive body typically comprises a material that remains solid at the temperatures at which the package is mounted onto a carrier such as a printed circuit board. For instance, a solder melting at temperatures in excess of about 280° C. or a suitable metal such as Au, Ni and/or Cu may be used for the metal body.

In an embodiment, the capping member may be a solder cap. Preferably, the discrete semiconductor device further comprises a further solder cap in conductive contact with the first surface.

In an alternative embodiment, the capping member may be a further semiconductor die to further increase the robustness of the discrete semiconductor package. The further die may be a further semiconductor device, e.g. to provide back-to-back diode functionality or may be a dummy die instead in case of a package limited to a single device only. In this embodiment, the respective bottom surfaces of the semiconductor dies may serve as the caps, i.e. the contact surfaces for a solder to mount the package on a carrier. This is particularly feasible if the die and further die comprise a solderable back metal stack onto which the carrier solder can be directly applied. In order to improve the solderability of such a package, capping layers may be provided on the respective bottom surfaces.

The advantage of such a package is that it can be manufactured in a batch process and can be placed sideways on a carrier such that the first surface and the second surface extend vertically from the carrier surface. This allows the package to be electrically connected to the carrier using solder materials that extend from the surface of the carrier to the (solder cap on the) first surface and the solder cap over the encapsulated solder portion on the contact of the second surface, thus avoiding the use of bond wires.

The conductive body may take the form of a ball or alternatively may have a pillar shape, e.g. a solder ball or pillar, a metal ball or pillar and so on.

In an embodiment, the encapsulation material extends along the respective sides of the semiconductor die that connect the first surface to the second surface. This has the advantage of offering further protection to the discrete semiconductor device against accidental damage.

According to another aspect of the present invention, there is provided a carrier comprising a first carrier contact and a second carrier contact, said carrier further comprising the discrete semiconductor device package according to an embodiment of the present invention, wherein the first carrier contact is conductively connected to the first surface and the second carrier contact is conductively connected to the conductive body by respective further solder portions. As already explained above, such a carrier has the advantage that the use of bond wires is avoided, thus making it easier, i.e. more cost-effective, to manufacture such a carrier.

According to yet another aspect of the present invention, there is provided a method of manufacturing a discrete semiconductor package, comprising providing a wafer comprising a plurality of discrete semiconductor devices, each of said discrete semiconductor devices having a first surface and a second surface opposite said first surface carrying a contact forming respective conductive bodies on each of said contacts; covering at least the surface of the wafer carrying the conductive bodies with an encapsulating material; singulating the discrete semiconductor devices; and providing a capping member over at least the conductive body of each of the discrete semiconductor devices. The singulation step may be performed by dicing or plasma-etching the wafer to provide the discrete semiconductor devices, and may be performed before or after applying the capping member. This allows for the manufacturing of a plurality of discrete semiconductor devices in a batch process, wherein each process step is simultaneously applied to a plurality of discrete semiconductor devices, thereby providing a cost-effective manufacturing method and a semiconductor device package that can be mounted on a carrier without the need for a wire bond.

In an embodiment, the method further comprises thinning the wafer surface including the respective first surfaces of the discrete semiconductor devices prior to said singulation step. This has the advantage that the robustness of the manufacturing process prior to the thinning step is improved due to reduced risk of wafer fracture.

In an embodiment, the capping member is a further semiconductor die from a further semiconductor wafer comprising a plurality of said dies. This is advantageous in case the package requires back-to back functionality, e.g. back-to-back diode functionality, and may further be advantageous in a packaging process in which the pillar-shaped conductive bodies are unavailable as this embodiment allows for the use of smaller conductive bodies, e.g. smaller solder or metal balls or bumps. In an alternative embodiment, the further wafer comprises a plurality of dummy dies in case the use of smaller bumps or balls is desirable for a package comprising a single active device only. In case of a further semiconductor die being used as the capping member, the singulation step may be performed subsequent to the provision of the capping member.

In another embodiment, the step of providing a capping member comprises providing a solder cap over at least the conductive body. Preferably, the method further comprises providing a further solder cap over the first surface of each of the discrete semiconductor devices. The presence of solder caps on a surface to be soldered improves the affinity of the surface to the solder material, thus improving the adhesion of the solder to the semiconductor device package contacts. A solder cap may also be provided over the further semiconductor die in case the latter is used as a capping member.

In an embodiment, the method further comprises partially singulating the discrete semiconductor devices prior to said covering step, thereby exposing the sides of each discrete semiconductor device that connect the first surface to the second surface; and wherein said covering step further comprises covering said sides with the encapsulating material. This has the advantage of also protecting the sides of the discrete semiconductor packages with the encapsulating material.

To this end, the method may comprise placing the wafer on a sawing foil prior to said partial singulation step; and stretching the sawing foil following said partial singulation step to expose the respective sides of the discrete semiconductor devices.

Alternatively, the method may comprise sawing the wafer with a sawing blade having a first thickness, and wherein said singulation step comprises sawing the encapsulated wafer with a sawing blade having a second thickness that is smaller than the first thickness.

BRIEF DESCRIPTION OF THE EMBODIMENTS

Figure 2:
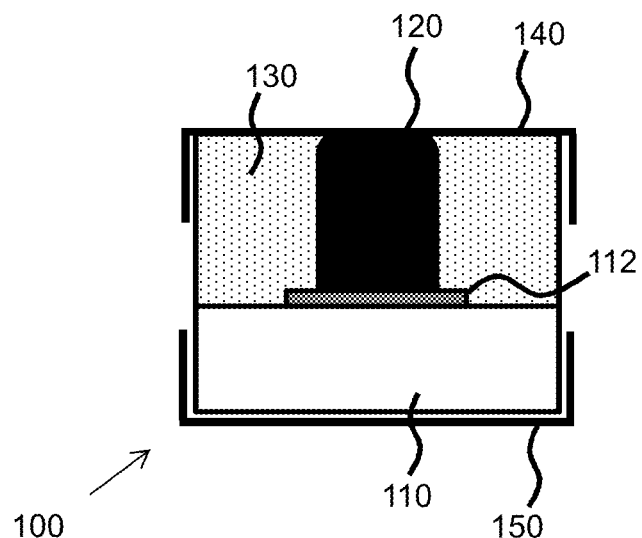
Figure 3:
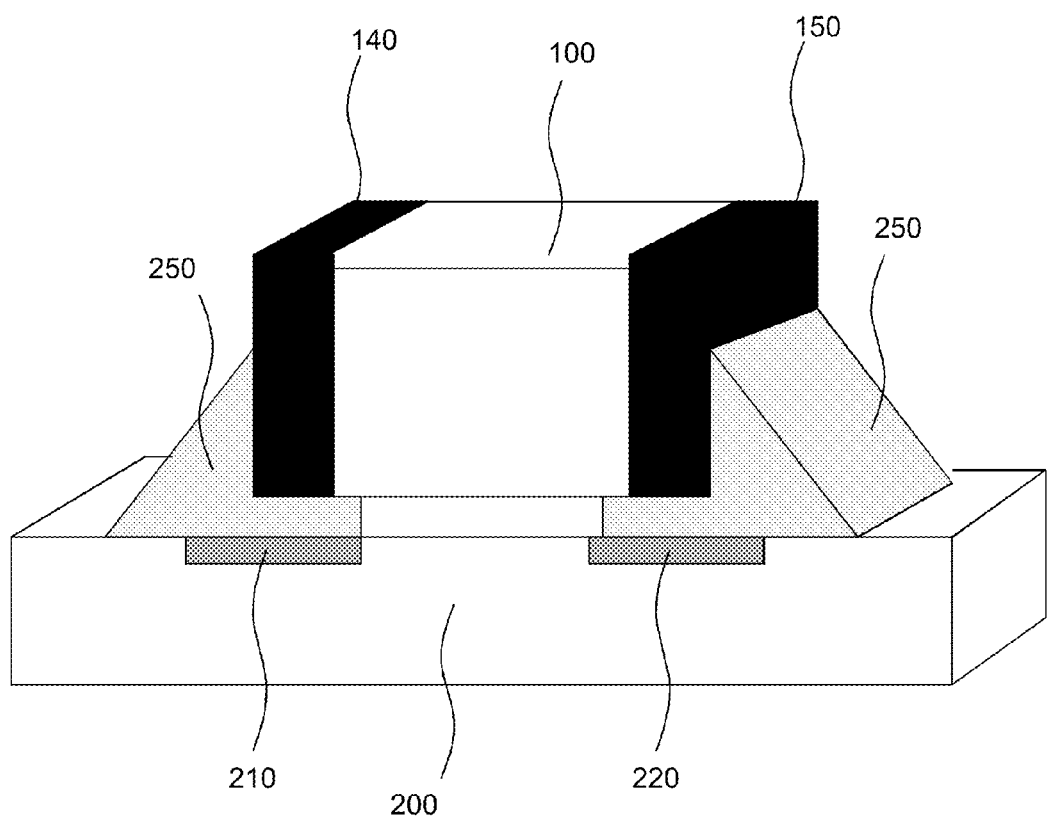
Figure 4:
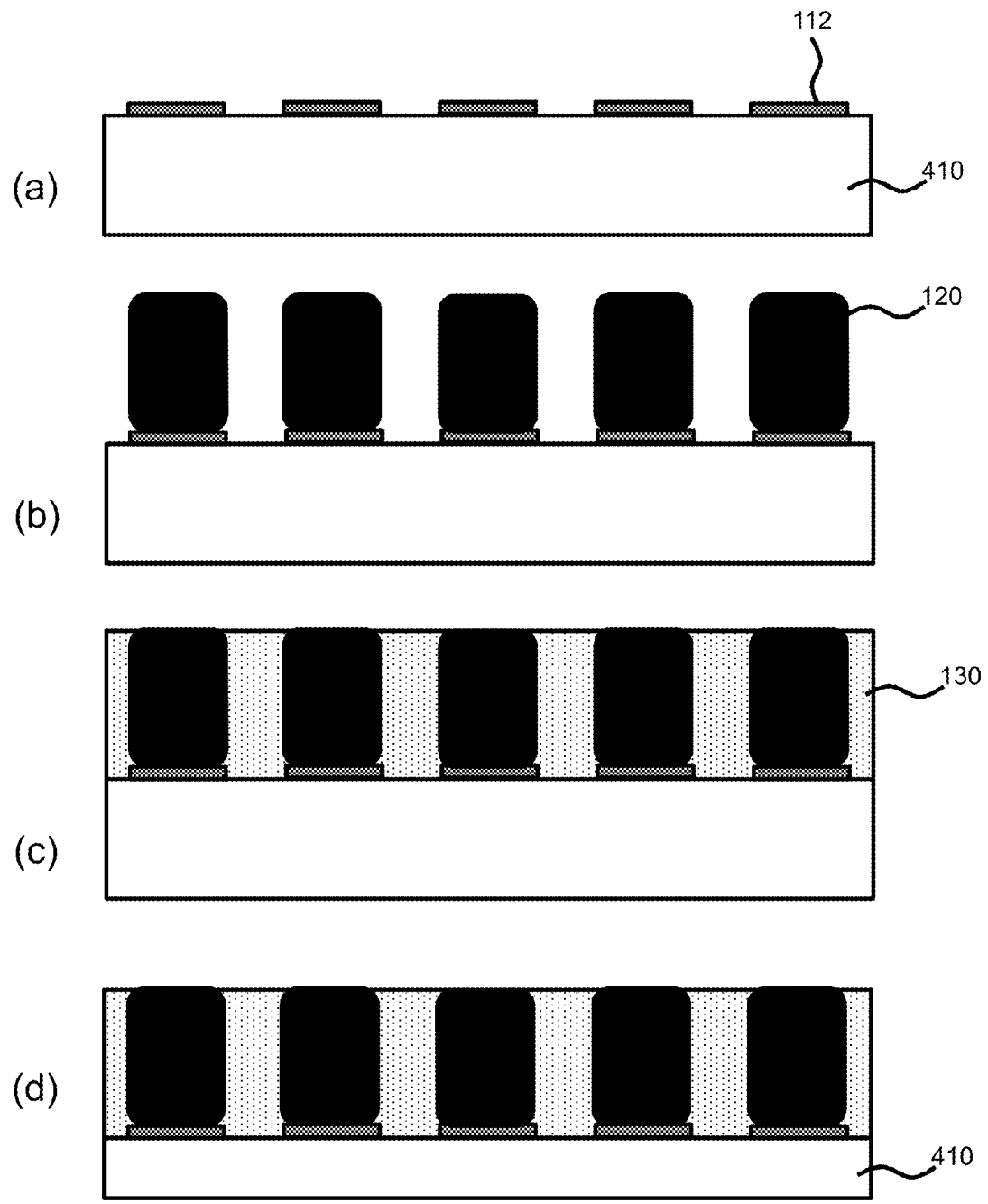
Figure 4:
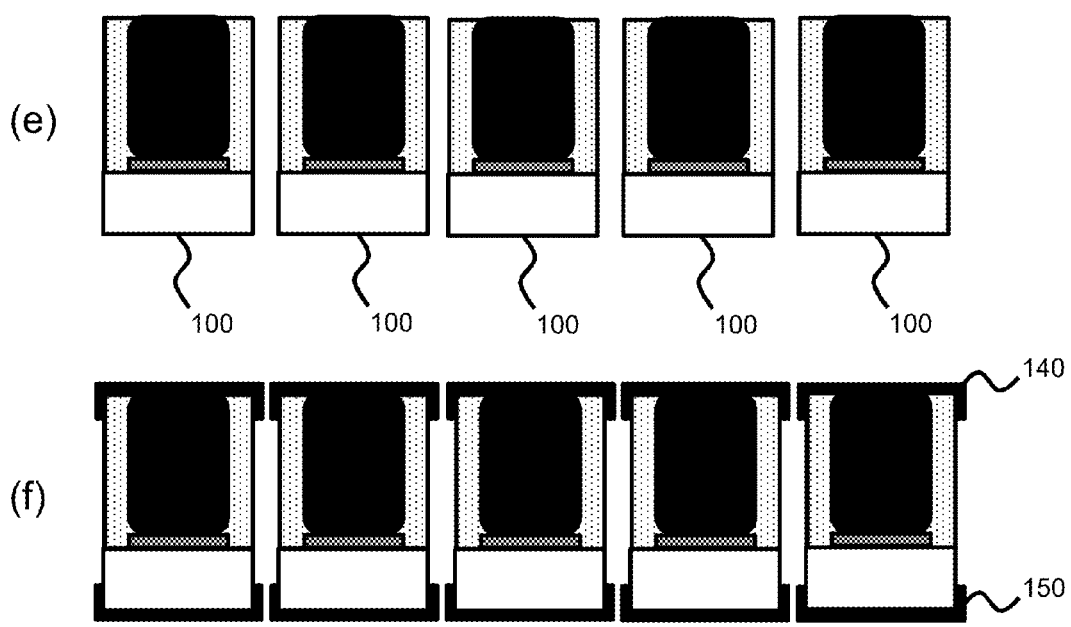
Figure 5:
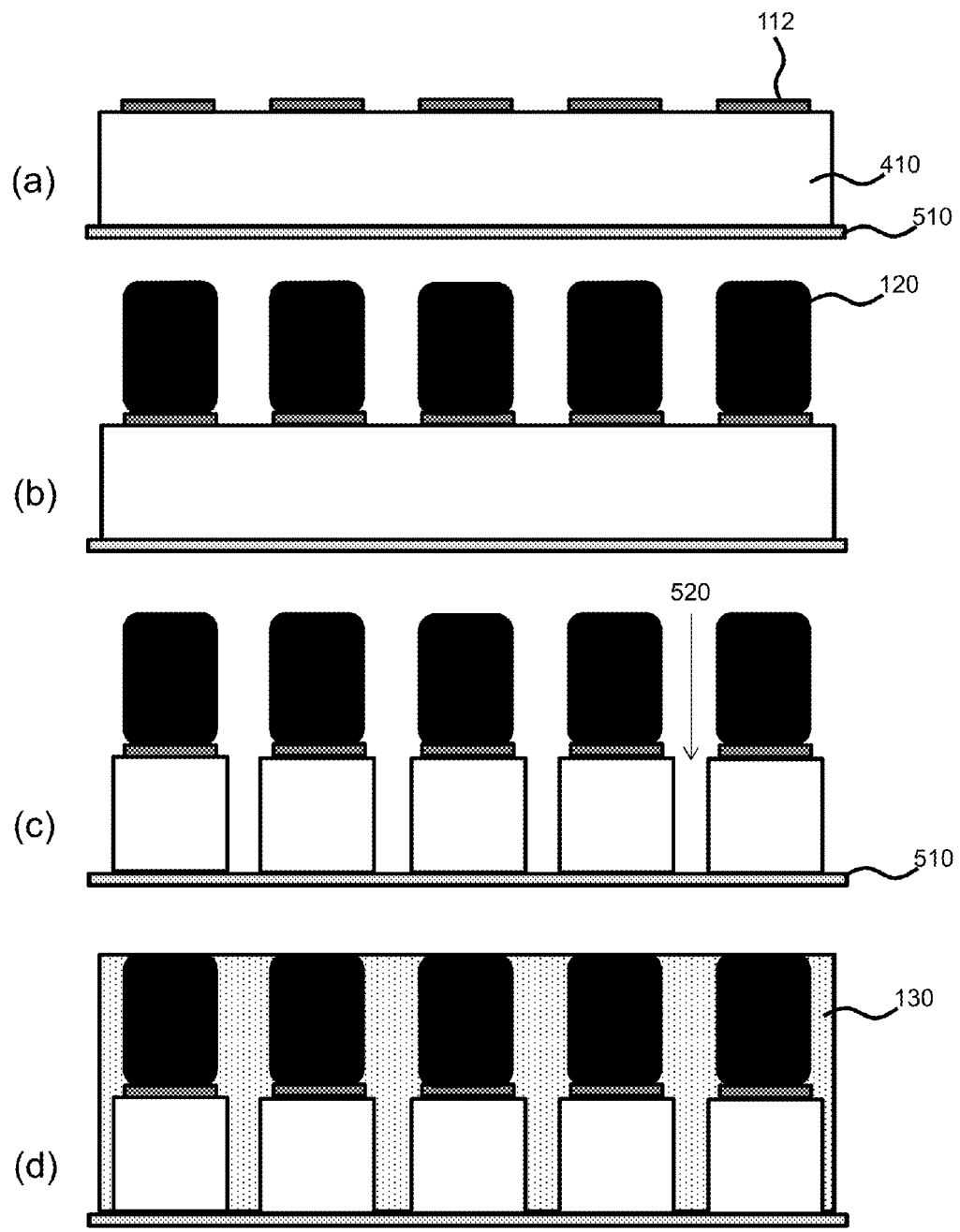
Figure 5:
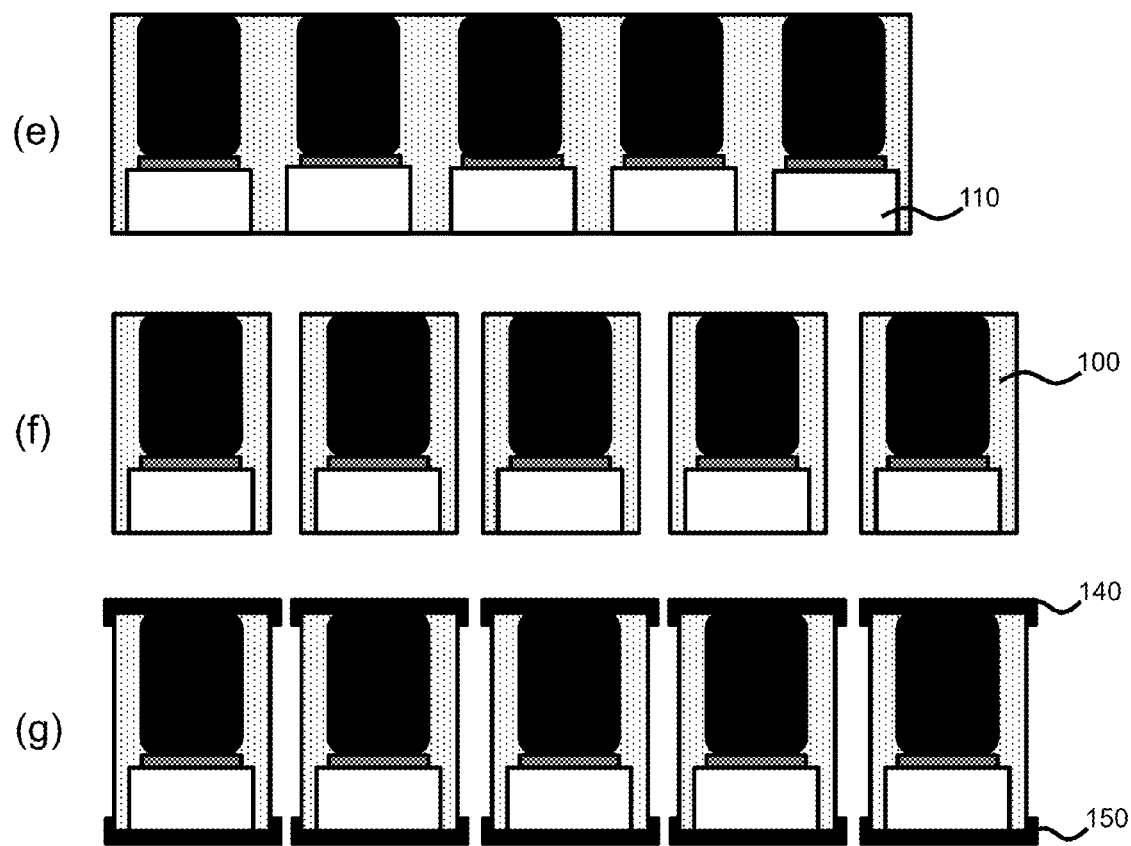
Figure 6:
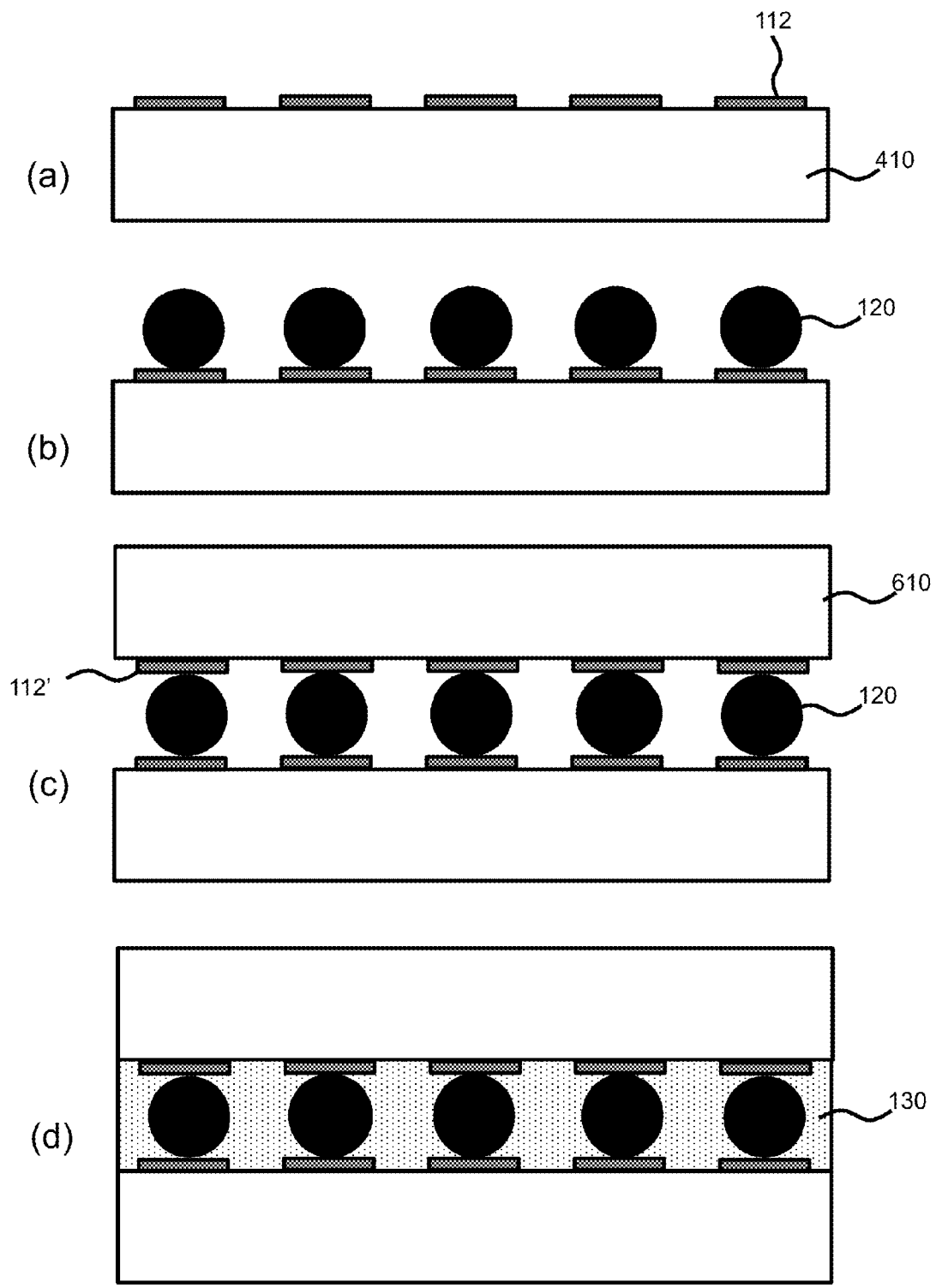
Figure 6:
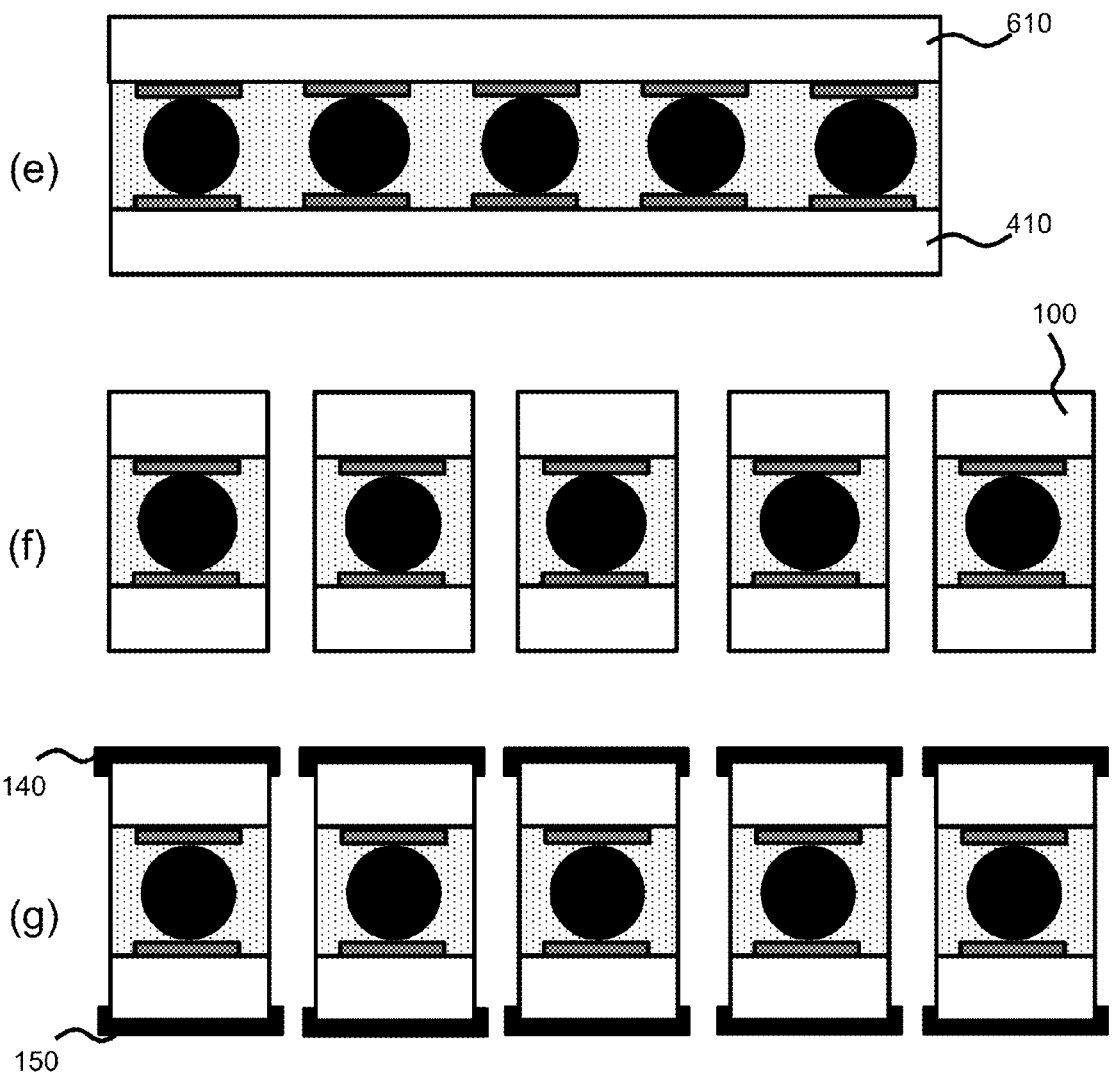

Embodiments of the invention are described in more detail and by way of non-limiting examples with reference to the accompanying drawings, wherein:

FIG. 1 schematically depicts a discrete semiconductor device package according to an embodiment of the present invention;

FIG. 2 schematically depicts a discrete semiconductor device package according to another embodiment of the present invention;

FIG. 3 schematically depicts a carrier including a discrete semiconductor device package according to an embodiment of the present invention;

FIG. 4 schematically depicts the various steps of a method of manufacturing a discrete semiconductor device package according to an embodiment of the present invention;

FIG. 5 schematically depicts the various steps of a method of manufacturing a discrete semiconductor device package according to another embodiment of the present invention; and FIG. 6 schematically depicts the various steps of a method of manufacturing a discrete semiconductor device package according to yet another embodiment of the present invention

DETAILED DESCRIPTION OF THE DRAWINGS

It should be understood that the Figures are merely schematic and are not drawn to scale. It should also be understood that the same reference numerals are used throughout the Figures to indicate the same or similar parts. FIG. 1 schematically depicts a first embodiment of a discrete semiconductor device package 100 of the present invention. A semiconductor die 110, e.g. a monocrystalline or polycrystalline silicon die, of a vertical semiconductor device, e.g. a vertical diode, carries a die contact 112, onto which a conductive body 120 is formed, which in this embodiment is a solder or metal ball having a sufficiently high melting point, e.g. above 280° C. Such conductive bodies 120 may be formed in any suitable manner; for instance by depositing a solder, applying a gold or copper ball by e.g. wire bonding, applying a Ni contact in a plating bath, growing a copper pillar in a plating bath and so on. The conductive body may further comprise a solderable plating, e.g. a Sn plating or a plating having a sufficiently high melting point to improve solderability of the conductive body 120.

The die contact 112 may be any suitable conductive material, e.g. a metal such as copper, aluminium, any suitable type of under-bump metallization and so on. To improve solderability, the die contact 112 may further be plated by a plating material selected from tin, silver, metal alloys, layer stacks such as Au provided with a Ni barrier layer (i.e. a NiAu finish), NiPdAu and so on. Any suitable conductive composition may be used for the formation of the conductive body 120.

The conductive body 120 is encapsulated in a molding material 130 such that the conductive body 120 makes conductive contact with a solder cap 140. The solder cap 140 may comprise any material that improves the adhesion of solder to the package 100. For instance, a plating material selected from tin, silver, metal alloys, layer stacks such as Au provided with a Ni barrier layer (i.e. a NiAu finish), NiPdAu and so on may be used. The molding material 130 typically is a polymer material, e.g. an epoxy resin. However, many other suitable molding polymer materials are known per se to the skilled person.

The lateral dimensions of the conductive body 120 are smaller than the lateral dimensions of the semiconductor die 110, with the molding material 130 laterally extending from the conductive body 120 to the edge of the semiconductor die 110 such that the space from the die surface to the top of the conductive body 120 in the discrete semiconductor device package 100 is completely filled with the molding material 130.

In addition to the first solder cap 140, the package 100 may further comprise a second solder cap 150 in conductive contact with a bottom contact (not shown) of the semiconductor die 110. As the provision of solder caps to such packages is well-known per se, this will not be explained in further detail for the sake of brevity. It suffices to say that any suitable solder cap material may be used for the provision for the solder caps 140 and 150. The solder cap 150 may be the same or a different material as the solder cap 140. The same material is preferred for the sake of avoiding additional complexity in the packaging process.

FIG. 2 shows an alternative embodiment of the discrete semiconductor device package 100 of FIG. 1, in which the conductive body 120 is replaced by a soldered or metal pillar 120. This demonstrates that the conductive body 120 in the discrete semiconductor device package 100 may have any suitable form.

Traditionally, discrete semiconductor device packages are mounted on a carrier such as a PCB in a top/bottom contact orientation, with the bottom contact directly bonded to the carrier, and with the top contact being a wire bonding contact for wire bonding the top contact to the carrier. The provision of the wire bonding contact requires a minimum area which has prohibited the reduction of the package size beyond certain dimensions.

In contrast, the replacement of a wire bonding contact with the integrated conductive body 120 in the discrete semiconductor device package 100 facilitates the sideways mounting of such packages on a carrier 200 such as a PCB as shown in FIG. 3, with the solder caps 140 and 150 providing the contacts from the package 100 to the outside world. Carrier 200 has a first contact 210 and a second contact 220, to which the discrete semiconductor device package 100 is soldered using solder portions 250. The provision of the solder caps 140 and 150 on the end portions of the discrete semiconductor device package 100 enables the soldering 250 to extend vertically from the respective contacts 210 and 220. The sideways mounting of the discrete semiconductor device package 100 for instance allows the package to be used with PCBs that have been designed to receive larger form factor components, e.g. 0603 diode packages.

An embodiment of a method to manufacture a semiconductor package according to FIG. 1 or 2 is shown in FIG. 4. In a first step (a), a wafer 410 is provided that comprises a plurality of the semiconductor die portions 110, each carrying a die contact 112. The wafer 410 may be any suitable wafer, e.g. a monocrystalline or polycrystalline silicon wafer, a silicon-germanium wafer, a wafer comprising a heterojunction such as a wafer comprising gallium nitride heterojunction devices and so on. The die contacts 112 may be of any suitable conductive material, e.g. a metal. This preferably is a metal that is readily available in the applicable semiconductor process, e.g. copper for a silicon-based process.

In step (b), respective conductive bodies 120, e.g. pillars or balls, are formed on each of the die contacts 112, after which the conductive bodies 120 are encapsulated in a molding material 130, e.g. a polymer or resin such as an epoxy resin or any other suitable polymer material, as shown in step (c). Excess molding material 130 may be removed in a planarization step (not shown) to expose the upper surfaces of the conductive bodies 120. Such encapsulation steps are well-known per se and will not be explained in further detail for reasons of brevity only.

The method may continue as shown in optional step (d), in which the wafer 410 is thinned to the desired thickness, e.g. by mechanical grinding and polishing followed by an optional back etch step or by a polishing step such as chemical mechanical polishing. The wafer 410 is subsequently singulated in step (e) to form the individual discrete semiconductor device packages 100, e.g. by means of dicing or plasma-etching, after each discrete semiconductor device package 100 is completed by forming a solder cap 140 over the surface comprising the exposed part of the conductive body 120 and forming a solder cap 150 over the exposed (bottom) surface of the semiconductor die 110 of the discrete semiconductor device package 100.

In the embodiment of FIG. 4, the molding material 130 is formed on top of the surface of the semiconductor die 110 that carries the contact 112, such that the conductive body 120 is (laterally) encapsulated by the molding material 130. However, in an alternative embodiment, the molding material 130 is made to extend over the sides of the semiconductor die 110 that connect the surface of the semiconductor die 110 that carries the contact 112 with the opposite surface (i.e. the bottom surface) of the semiconductor die 110, such that the molding material 130 also encapsulates the semiconductor die 110, which has the advantage of added protection for the discrete semiconductor device package 100.

An embodiment of a method of manufacturing such discrete semiconductor device packages 100 is shown in FIG. 5. Steps (a) and (b) are identical to steps (a) and (b) of the method shown in FIG. 4 and described above, such that these steps will not be described in detail again for the sake of brevity only. It is noted that in FIG. 5, the wafer 410 is placed on a sawing tape or foil or some other mounting aid 510, but it should be understood that such a mounting aid may also be used in the method shown in FIG. 4.

In step (c), the wafer 410 is partially diced to create trenches 520 in between the individual semiconductor devices, e.g. by a plasma etching or sawing step, with at least the mounting aid 510 keeping the individual semiconductor devices together. The width of the trenches 520 may be increased, i.e. the individual semiconductor devices may be spaced further apart from each other by stretching the mounting aid 510. Alternatively, a sawing blade having a relatively large thickness may be used to obtain the desired width for the trenches 520.

Next, the resultant structure is encapsulated in the molding material 130 as shown in step (d). It is noted that the trenches 520 are also filled with the molding material 130 in this step, thus providing encapsulation at the sides of the respective semiconductor dies 110. As before, if necessary a planarizing step such as a chemical mechanical polishing step may be applied to the molding material 130 to expose the upper surfaces of the conductive bodies 120. In optional step (e), a wafer thinning step may be applied as previously explained, followed by the singulation step (f) to form the individual discrete semiconductor device packages 100, e.g. by means of dicing (sawing) or plasma-etching. In an embodiment, step (c) is performed by a dicing step using a sawing blade of a first thickness and the singulation step (f) is performed by a dicing step using a sawing blade of a second thickness that is smaller than the first thickness, such that the sawing blade of a second thickness can follow the trenches 520 filled with the molding material 130 without completely removing the molding material 130 from these trenches.

As before, each discrete semiconductor device package 100 is completed as shown in step (g) by forming a solder cap 140 over the surface comprising the exposed part of the conductive body 120 and forming a solder cap 150 over the exposed (bottom) surface of the semiconductor die 110 of the discrete semiconductor device package 100.

A further embodiment of a method of the present invention is shown in FIG. 6. Steps (a) and (b) are substantially identical to steps (a) and (b) of the method shown in FIG. 4 and described above, such that these steps will not be described in detail again for the sake of brevity only. The only difference is that the conductive body 120 is a bump or ball rather than a pillar as shown in FIG. 4. In step (c), a further semiconductor wafer 610 is provided consisting of a plurality of further die portions, each carrying a die contact 112'. The further die portions may define a separate semiconductor device, e.g. a separate diode, to form a back-to-back semiconductor device package, or alternatively may be a dummy die portion, in which case the final package will only contain a single semiconductor device. The die contacts 112' are conductively connected, e.g. soldered, to the conductive body 120 as shown in step (c), such that the further semiconductor dies can be seen as a capping member of the conductive body 120. The main advantage of a two-sided wafer-based packaging process is that it reduces manufacturing complexity and therefore the cost of the resulting discrete semiconductor device package 100.

In an alternative embodiment, which will not be explicitly shown for the sake of brevity, the further semiconductor wafer 610 may be divided into smaller portions prior to soldering the die contacts 112' of such a wafer partition to the conductive bodies 120. This may be necessary in order to obtain the required alignment accuracy in the placement of the further semiconductor die 610 on the solder portions 120.

In step (d), the conductive bodies 120 are encapsulated in the encapsulation or molding material 130 as previously explained, after which an optional thinning step of the wafer 410 and/or the further wafer 610 may be performed as previously explained This is shown in step (e). In subsequent step (f), the individual discrete semiconductor device packages 100 are formed by a singulation step, e.g. a dicing (sawing) or plasma-etching step, after which the solder caps 140 and 150 are formed over the respective bottom surfaces of the semiconductor dies in each package as shown in step (g).

It should be understood that in case of a discrete semiconductor device package comprising back to back semiconductor dies as shown in FIG. 6, step (g) may be omitted in an alternative embodiment, i.e. each package may be provided without solder caps, in which case the bottom surfaces of the semiconductor dies act as the caps of the package as previously explained. This is particularly feasible if the wafers 110 and 610 comprise a solderable back metal stack onto which the carrier solder can be directly applied.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A discrete semiconductor device package comprising:
    a vertical semiconductor device, integral to the discrete semiconductor device package, including,
        a semiconductor die, with a lateral dimension, having a first surface and a second surface opposite said first surface, said second surface carrying an electrical contact;
        the semiconductor die having a P-doped region, an N-doped region and a PN junction area therebetween, wherein the semiconductor die is oriented vertically for passing current vertically relative to the lateral dimension:
    a conductive body electrically connected on said electrical contact of the semiconductor die of the vertical semiconductor device, wherein the conductive body has a lateral dimension smaller than the lateral dimension of the semiconductor die;
    an encapsulation material formed on top of the second surface to laterally encapsulate said conductive body; and
    a capping member in electrical contact with the conductive body, said capping member extending over the encapsulation material.

2. The discrete semiconductor device package of claim 1, wherein the capping member comprises a further semiconductor die or a solder cap.

3. The discrete semiconductor device package of claim 2, further comprising a solder cap on the further semiconductor die.

4. The discrete semiconductor device package of any of the preceding claims, further comprising a further solder cap in conductive contact with the first surface.

5. The discrete semiconductor device package of any of the preceding claims, wherein the conductive body has a ball or pillar shape.

6. The discrete semiconductor device package of any of the preceding claims, wherein the encapsulation material also extends along the respective sides of the semiconductor die that connect the first surface to the second surface.

7. A carrier comprising a first carrier contact and a second carrier contact, said carrier further comprising the discrete semiconductor device package of claim 1, wherein the first carrier contact is conductively connected to the first surface and the second carrier contact is conductively connected to the conductive body by respective solder portions.

8. The discrete semiconductor device package of claim 1, wherein the semiconductor die having a P-doped region, an N-doped region and a PN junction area is a diode.

9. The discrete semiconductor device package of claim 8, wherein the P-doped region of the diode is located below or above the N-doped region.

* * * * *